United States Patent [19]

Balda et al.

[11] Patent Number: 4,523,372

[45] Date of Patent: Jun. 18, 1985

[54] PROCESS FOR FABRICATING SEMICONDUCTOR DEVICE

[75] Inventors: Raymond J. Balda; Yefim Bukhman, both of Tempe; Willis R. Goodner, Chandler, all of Ariz.

[73] Assignee: Motorola, Inc., Schaumburg, Ill.

[21] Appl. No.: 607,868

[22] Filed: May 7, 1984

[51] Int. Cl.$^3$ .......................................... H01L 21/312
[52] U.S. Cl. ........................................ 29/590; 29/578; 29/591; 357/71; 156/646; 156/643; 156/661.1; 148/DIG. 131
[58] Field of Search ................ 29/578, 590, 591; 156/643, 659.1, 660, 661.1, 646; 357/71; 427/385.5; 204/192 E; 148/DIG. 131

[56] References Cited

U.S. PATENT DOCUMENTS

| | | | |
|---|---|---|---|
| 4,092,442 | 5/1978 | Agnehotri et al. | 204/192 E |
| 4,184,909 | 1/1980 | Chang et al. | 156/659.1 |
| 4,244,799 | 1/1981 | Fraser et al. | 204/192 E |
| 4,357,203 | 11/1982 | Zelez | 156/659.1 |
| 4,367,119 | 1/1983 | Logan et al. | 156/643 |
| 4,430,153 | 1/1984 | Gleason et al. | 156/659.1 |
| 4,444,617 | 4/1984 | Whitcomb | 156/643 |
| 4,464,460 | 8/1984 | Hiraoka et al. | 156/659.1 |

Primary Examiner—Brian E. Hearn
Assistant Examiner—Hunter L. Auyang
Attorney, Agent, or Firm—John A. Fisher

[57] ABSTRACT

A process is disclosed for fabricating semiconductor devices, and especially for fabricating semiconductor devices having multiple levels of metallization separated by polyimide or other organic materials. The process avoids the sputter etching and redeposition of the lower metal layer during reactive ion etching of openings through the organic layer. Sequential layers overlying the first layer of metallization include a layer of oxide, a layer of organic material, and a second layer of oxide. The second layer of oxide functions as a hard mask for patterning the organic material. The first layer of oxide acts as an etch stop and protective layer to prevent attack of the underlying metal during reactive ion etching of the organic layer. The first layer of oxide is of limited areal extent to avoid subsequent problems with the organic layer. The oxide located at the bottom of the opening through the organic material as well as the second layer of oxide and any oxide which is sputtered and redeposited on the walls of the opening through the organic material are easily removed in a single etch step without adversely affecting the underlying metallization. After removing the oxide, a second layer of metallization is applied and patterned as required.

13 Claims, 9 Drawing Figures

PROCESS FOR FABRICATING SEMICONDUCTOR DEVICE

BACKGROUND OF THE INVENTION

This invention relates generally to a process for fabricating semiconductor devices, and more specifically, to a process for patterning organic layers on semiconductor devices.

Polyimide and other organic materials are finding increased usage in semiconductor device processing as dielectric materials and especially in applications where the dielectric material provides a planarization of the semiconductor wafer. One particular process in which polyimide material has found application is in the process for fabricating devices having multiple layers of interconnection. For example, in a complex integrated circuit the interconnection of all devices and all device functions may require more than one layer of metallization. In processing the device, a first layer of metallization, such as aluminum, is formed overlying the surface of the semiconductor device and interconnecting selected ones of device areas on the structure. A layer of organic insulator is then applied over the first layer metallization and openings are formed through the insulator at selected locations to allow interconnection between the first and subsequent interconnecting layes. A second layer of interconnecting material is then deposited and patterned on the relatively planar surface of the organic insulator to contact and interconnect further device functions. The two layers of interconnection are electrically isolated from each other by the intervening insulator layer except at locations where intentional contact between the layers is effected through one of the openings. Subsequent layers of interconnection, as required, are similarly selectively separated by layers of organic insulation. A layer of organic insulator may also be used as a final passivating layer over the otherwise completed device.

As circuit functions become more complex, device sizes decrease and device density increases. This requires smaller and smaller feature sizes including the width and spacing of interconnecting lines. In order to process devices having these fine interconnecting lines with a high degree of reproducability and reliability, it is necessary that the surface upon which the lines are formed be relatively planar. In addition, to insure the desired isolation between interconnection layers, the insulating material must be relatively thick. The combination of the two requirements dictates that the layer itself provide some degree of surface leveling. Materials such as polyimides are particularly suited for such an application. The material is applied in thick layers as a liquid and, regardless of the topography of the underlying layer, can provide a relatively flat surface upon which subsequent interconnection layers can be formed.

The requirement of small feature sizes with close spacing between adjacent features further requires that an anisotropic etch technique such as reactive ion etching be used to form the openings through the thick insulating layer positioned between adjacent layers of interconnecting material. Reactive ion etching, however, although providing the desired degree of anisotropy, presents problems with the device processing. One particular problem, for example, relates to the sputter etching and subsequent redeposition of materials during the reactive ion etch processing. This problem is encountered especially in those applications in which the thickness of the organic layer varies considerably over the surface of the device, as is common where the layer is used for planarization. Some underlying portions of the device which have a relatively thin layer of organic material thereover may be exposed to the reactive ion etching while openings are still being formed through other relatively thicker portions of the organic layer. That is, some portions of the pattern of openings through the organic layer will be subjected to a considerable overetch in order to insure that openings are properly formed through the thicker portions. During this overetch time, the material underlying the opening is subjected to the reactive ion etching. If the underlying material is aluminum metallization, for example, and the organic layer is being reactive ion etched in oxygen, aluminum may be sputter etched from the surface of the exposed aluminum metallization. The sputtered aluminum, in turn, can chemically react with the oxygen to form aluminum oxide which is redeposited on the walls of the opening formed through the organic material. The aluminum oxide is a relatively inert and chemically resistant material which is relatively unaffected by subsequent processing of the organic material. The result is a "picket fence" lining each of the openings through the organic material which can seriously interfere with the reliability of the device. The aluminum oxide picket fence is relatively unaffected by subsequent etching of the layers and is therefore left standing around the opening when the organic material is etched. The picket fence may also partially collapse into the opening during subsequent processing, causing at least a partial blockage of the opening. It has been suggested that the redeposited material be subsequently removed by etching in a liquid etchant which is selected dependent upon the chemical nature ot the redeposited material. For example, if the underlying material which has been sputter etched is aluminum, the redeposited material is etched with a mixture of ethylene glycol and buffered hydrofluoric acid. If the underlying material is gold, the redeposited material is removed in an aqueous solution of potassium iodide and iodine. The use of such liquid etchants, however, is not an acceptable solution, because the liquid etchant attacks and seriously degrades the underlying substrate material. In the case of aluminum metallization, for example, the aluminum oxide is removed, but only at the expense of also etching the underlying exposed aluminum metallization.

In view of the foregoing problems, a need existed for an improved process for patterning organic layers using anisotropic reactive ion etching.

It is therefore an object of this invention to provide such an improved process for the reactive ion etching of organic layers.

It is another object of this invention to provide an improved process for the reactive ion etching of polyimide layers.

It is a still further object of this invention to provide an improved process for the fabrication of semiconductor devices.

BRIEF SUMMARY OF THE INVENTION

The foregoing and other objects and advantages of the invention are achieved in a process employing protective etch-stop layers under organic insulating layers. In one embodiment of the invention a first metal layer is overlaid by a first protective layer followed by a thick layer of organic material such as polyimide. The polyimide is etched down to the first protective layer by reactive ion etching. The interposed protective layer prevents the sputter etching and redeposition of the first layer metal. After etching the protective layer, a second metallization layer and a second protective layer are formed overlying the device. The second protective layer is patterned and then, in turn, used to pattern the second metallization layer. A thick layer of organic material such as polyimide is then deposited over the whole structure. The second polyimide layer is patterned by reactive ion etching down to the second protective layer which acts as an etch stop and again prevents the sputter etching and redeposition of the metallization. The protective layer is then etched from the bottom of the openings formed through the polyimide layer to allow contact to the second metallization layer.

DETAILED DESCRIPTION OF PREFERRED EMBODIMENTS

Figure 1:
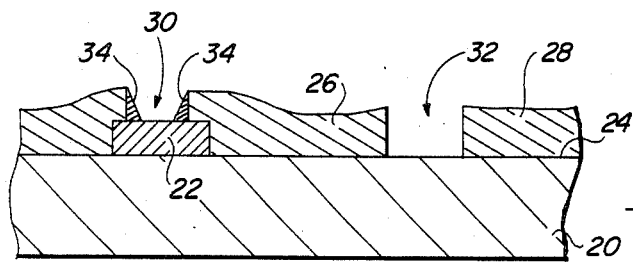
FIG. 1 illustrates a prior art structure and problems attendent therewith.

FIG. 1 illustrates a portion of a semiconductor device being processed in accordance with a prior art process. The device includes a semiconductor substrate 20 which can be, for example, a silicon substrate. The substrate may include diffused regions, junctions, insulating layers, and the like. Formed on the semiconductor substrate is a metallization pattern, a portion of which is shown at 22. The metallization is typically aluminum or an alloy of aluminum, but can be other metals, silicides, doped polycrystalline silicon, or other conductor material. At this point in the processing the semiconductor device has an irregular upper surface including the surface 24 of the semiconductor substrate (which is shown here to be flat but may include steps and non-uniformities from prior processing) and the step associated with metallization pattern 22. To both electrically isolate the underlying metallization from subsequent layers of metallization and to at least partially planarize the surface, a layer of polyimide or other organic insulator material 26 is applied to the surface of the device. Polyimide is applied as a liquid and, depending on the thickness of the applied layer as well as process conditions of the application, smooths out irregularities in the surface and tends to planarize the surface. Polyimide layer 26 is thinner over metallization 22 than over one of the lower lying portions of the substrate surface such as at 28. Contact openings 30 and 32 are formed photolithographically through the polyimide layer. Contact opening 30 allows contact to interconnect metallization 22 while contact opening 32 may allow contact to the substrate or may, for example, be an opening through the polyimide layer for a scribe grid at the periphery of the device. In etching openings 30 and 32 through the polyimide layer, opening 30 is etched through a thinner layer of material than is opening 32. During the etching of opening 32 through the entire thickness of the polyimide layer, opening 30 is thus considerably overetched.

After opening 30 has been formed, the surface of metallization 22 is exposed to and sputter etched by the reactive ions (usually oxygen ions) used to etch the polyimide. The oxygen ions react with the back sputtered aluminum from interconnect metallization 22 to form aluminum oxide which is redeposited on the walls of opening 32 as an aluminum oxide deposit 34. Aluminum oxide is a resistant material, and subsequent etching of the polyimide layer leaves the deposited aluminum oxide 34 standing as a "picket fence" surrounding the original opening 30. The picket fence detracts from reliability as it can affect step coverage, metallic penetration into opening 30, and the like.

Figure 2:
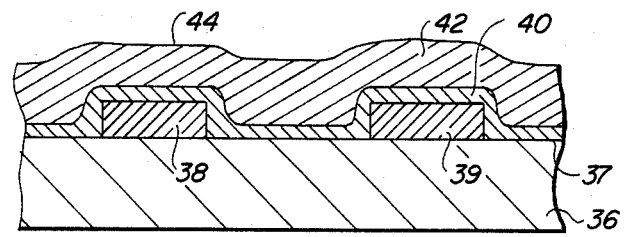
FIGS. 2-9 illustrate steps in a process for fabricating a semiconductor device in accordance with the invention.

FIGS. 2-9 illustrate steps in a process, in accordance with the invention, which overcomes the difficulties of the aforementioned prior art process. Each of the figures illustrates, in cross section, a portion of a semiconductor device during stages of processing. FIG. 2 illustrates a semiconductor substrate 36 which can be, for example, a substrate of silicon or other semiconductor material which may have been processed to form diffused regions, junctions, insulating layers, and the like. Substrate 36 is not, however, limited to semiconductor materials, as the invention is also applicable to the fabrication of other devices such as bubble memories and the like. The surface 37 of semiconductor substrate 36 is here indicated to be a planar surface, but the surface need not be planar, and in fact may have steps and other irregularities resulting from prior formed interconnections, insulators, and the like. Positioned on this portion of semiconductor substrate are two portions 38 and 39 of a first layer of patterned metallization. The metallization provides contact to underlying device region as well as interconnection between device regions. The term "metallization" is herein used to encompass aluminum or aluminum alloys, other metal systems, doped polycrystalline silicon, silicides, and the like. To prevent sputter etching and redeposition of the metallization during the subsequent patterning of a later applied layer of organic material, the patterned metallization is overlaid by a protective layer 40. The protective layer has a chemical composition such that it is characterized by a low sputtering rate with respect to the ionic species used for reactive ion etching the later formed polyimide layer and such that it does not react with the ionic species to form a difficult to etch redeposited layer. The protective layer is a thin, conformal layer which can be controllably etched in a relatively short etch process step. Preferably, the protective layer is a low temperature deposited layer of silicon oxide, silicon nitride, or the like. The protective layer can be, for example, a low temperature CVD or plasma deposited silicon dioxide layer having a thickness of about 100-500 nm. Overlying protective layer 40 is a thick layer 42 of organic insulating material. Layer 42 is preferably a polyimide material having a thickness of about 1-3 micrometers but may also be of other organic insulator materials. The thick organic insulator layer provides insulation over the patterned metallization, and also has a leveling effect which provides a surface 44 which is more nearly planar than the underlying surface.

Figure 3:
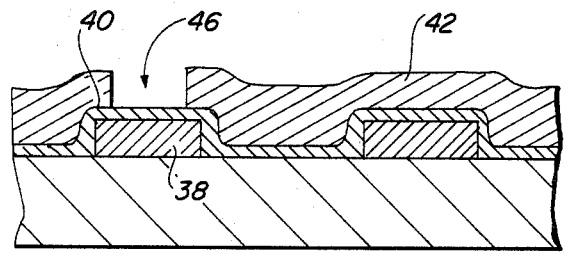

A pattern of opening is then formed in polyimide layer 42 to allow selective contact to underlying metallization or other device regions. As illustrated in FIG. 3, an opening 46 is formed through the polyimide layer to eventually allow contact to metallization 38. The opening is formed by reactive ion etching using oxygen ions and using a photoresist or other mask (not shown) to define the location and size of the openings. The reactive ion etching proceeds through the polyimide layer and terminates on protective layer 40. Protective layer 40, formed of SiO$_2$ or the like, has a low sputtering rate in oxygen plasma. Only a small amount of material is therefore sputter etched from the protective layer even though the polyimide layer may be severely overetched at the location of opening 46 in order to allow etching through a thicker region of polyimide elsewhere on the semiconductor device.

Figure 4:
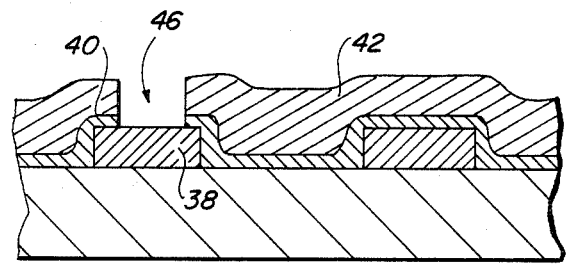

As illustrated in FIG. 4, protective layer 40 is etched from the bottom of opening 46 using the patterned polyimide as an etch mask. The protective layer can be removed using wet chemistry, plasma etching, reactive ion etching, or the like. Because the protective layer is a conformal coating, the thickness of the protective layer exposed at the bottom of any opening such as opening 46 will be approximately the same and will be of limited thickness so that the layer can be etched quickly and uniformly from the bottom of each opening without severe overetching of any one opening. During the etching of protective layer 40, any material which has been sputter etched and redeposited on the walls of opening 46 is also etched in the same etchant which etches layer 40. For example, if layer 40 is formed of SiO$_2$, a silicon oxide is deposited on the walls of opening 46; both the SiO$_2$ and the silicon oxide are etched, for example, in a buffered solution of hydrofluoric acid. Opening 46 is thus formed through the polyimide layer 42 and protective layer 40 without severe sputter etching of metallization 38 and without the deposition of an etch resistant picket fence around opening 46.

Figure 5:
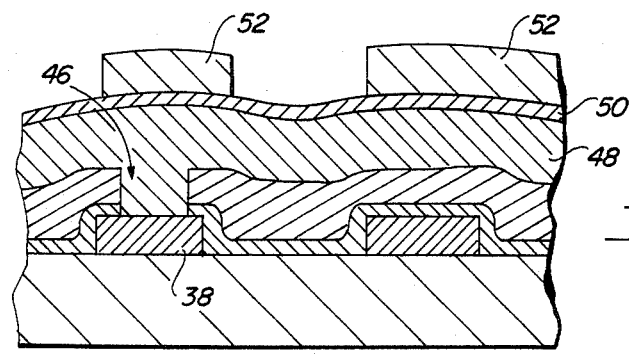

To continue the processing of the device structure including multiple levels of device interconnection, a second layer of metallization 48 is deposited over the surface of the device and into opening 46 to make contact with underlying metallization 38 as illustrated in FIG. 5. Overlying the second layer of metallization is a second protective layer 50 which is formed, like the first protective layer 40, preferably from an inorganic insulating material such as silicon oxide or silicon nitride. A layer of photoresist 52 is then deposited on the second protective layer and patterned to form a photolithographic mask for pattern etching the second protective layer and second layer of metallization.

Figure 6:
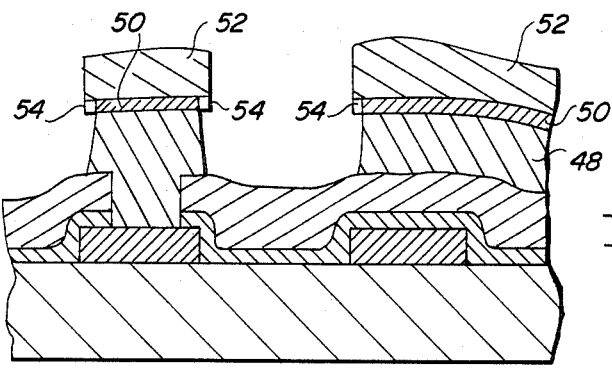

As illustrated in FIG. 6, the patterned photoresist 52 is used as an etch mask to first pattern etch the second protective layer 50. Metallization 48 is then etched using the patterned photoresist and second protective layer as an etch mask. Both the second protective layer and the metallization are etched using wet chemicals, plasma etching, reactive ion etching, or the like. The metallization is generally etched in an isotropic etching system which leads to an undercutting of the photoresist and protective layer etch mask. The resulting lip 54 of the second protective layer must then be removed to avoid step coverage problems with subsequent deposited layers. The lip is easily etched, for example, by dipping the structure into a liquid etchant in which the protective layer is soluble. If the metallization is, instead, etched in an anisotropic etch manner, no overhanging lip will be produced so that this step can be omitted.

Following the patterning of the protective layer and metallization, photoresist patterning layer 52 is removed. The structure at this point in the process includes a patterned metallization 48 with a thin protective layer of inorganic material overlying the top surface of the metallization. The protective layer is patterned in substantially the same pattern as is the metallization. It is important to the structure that the protective layer be of limited extent and not cover the whole or substantially the whole surface of the device. This requirement results from the properties of polyimide and similar organic insulating materials. Polyimide layers absorb water and it is imperative that this water not be sealed in the polyimide layer by a large, substantially continuous and impervious layer overlying the polyimide. There must be a ready path for the escape of the absorbed water if the device is to be subsequently exposed to a high temperature. In this context, high temperature means temperatures greater than about 400° C. such as are encountered during the attachment of the die to a package.

Figure 7:
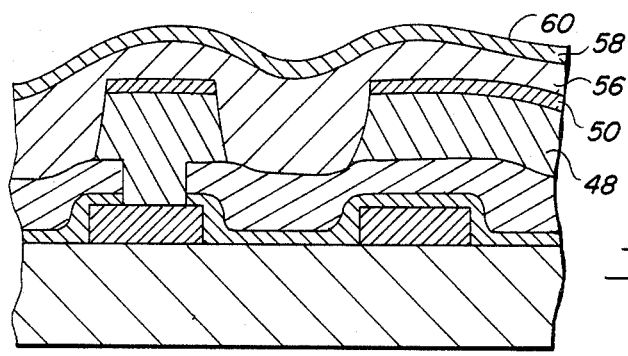

As illustrated in FIG. 7, the process is continued by applying a second layer 56 of polyimide or other similar organic insulator in a thick layer which electrically insulates the underlying structure and helps to level or planarize the uppermost surface 58 of the device. Overlying the thick polyimide layer is a masking layer 60 which is preferably of a material similar to that of protective layer 50. The use of masking layer 60 illustrates a further embodiment of the invention, providing an option with respect to the patterning of the thick organic layers. If formed of the same material as the protective layer 50, layer 60 should have a thickness equal to or less than that of the protective layer.

Figure 8:
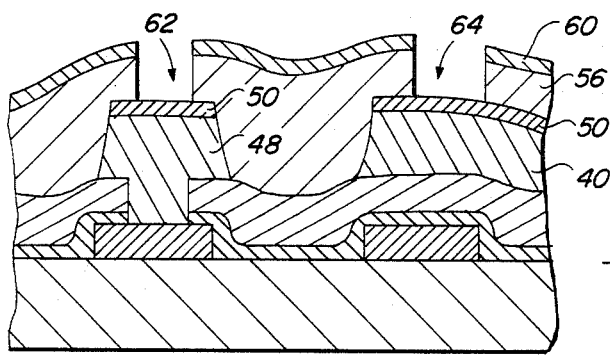

As the process continues, a layer of photoresist (not shown) is applied over masking layer 60. The photoresist layer is patterned and used to similarly pattern the masking layer 60. Masking layer 60 is then used as a reactive ion etch mask for the reactive ion etch patterning of the organic layer 56. As illustrated in FIG. 8, two openings 62, 64 are formed through the organic layer to expose the underlying protective layer 50 positioned overlying metallization 48. The use of etch mask 60, having different reactive ion etch properties than the material of organic layer 56, allows the reactive ion etching of the organic material without the erosion of the masking layer as would be the situation using only an organic photoresist as an etch mask. Etching proceeds through the organic layer to the protective layer 50 which acts as an etch stop and which allows significant overetching of any opening while continued etching is occurring at other locations. Protective layer 50 is characterized by a low sputtering rate in the reactive ion used for etching the organic material. Consequently, only a limited amount of material from the protective layer is sputter etched from the bottom of openings 62 and 64 and redeposited on the edges of the openings. Additionally, the sputtered material redeposited on the walls of opening 62 and 64 results from the reaction of the sputtered material from protective layer 50 and the impinging oxygen ions and is an easily etchable material. The use of the protective layers permits the etching of the thick organic layer without regard for the underlying metallization.

Figure 9:
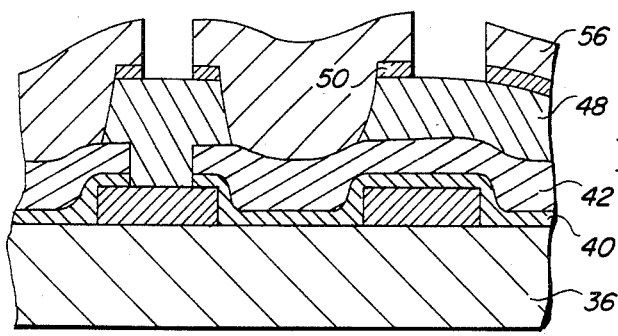

As illustrated in FIG. 9, the process is continued by the etching of those portions of protective layer 50 which are exposed through openings in the organic layer 56. At the same time that protective layer 50 is being etched, so also is masking layer 60 and any deposit which has formed on the walls of openings 62 and 64. Protective layer 50 can be quickly and easily etched using wet chemicals, plasma etching, reactive ion etching, or the like without seriously attacking the underlying exposed portion of metallization 48.

The structure as illustrated in FIG. 9 may be continued, if necessary, by the addition of subsequent interconnect metallization layers in the same manner. Alternatively, depending upon the function implemented in the device, the device illustrated may be the completed structure, and the second layer of metallization 48 may be the final layer of metallization. In that case, the portion of metallization layer 48 exposed through openings 62 and 64 may represent, for example, bonding pad areas to which interconnecting wires are subsequently attached. The second layer of organic material 56 then serves as the final passivation layer for the device. If subsequent layers of metallization are added to the structure, organic layer 56 serves as an interlayer dielectric isolation.

Thus it is apparent that there has been provided, in accordance with the invention, a device fabrication process which fully meets the objects and advantages set forth above. While the invention has been described and illustrated with reference to specific embodiments thereof, it is not intended that the invention be so limited. Other layer thicknesses, etchants, or layer compositions than those specifically enumerated are among the variations and modifications which may occur to those skilled in the art after review of the foregoing description. It is intended that all such variations and modifications falling within the spirit of the invention be included within the appended claims.

We claim:

1. A process for fabricating a semiconductor device which comprises the steps of: providing a semiconductor substrate having a first layer of organic material thereon; providing a second layer of first metallization overlying said substrate; forming a third layer of a first insulating material overlying said second layer of first metallization; patterning said third layer; patterning said second layer of first metallization, leaving said third layer overlying remaining portions of said second layer; forming a fourth layer of organic material overlying said third layer; forming a fifth layer of said first insulating material overlying said fourth layer of organic material; forming openings in said fifth layer to expose portions of said fourth layer of organic material; reactive ion etching said fourth layer of organic material through said openings in said fifth layer to expose portions of said third layer; and simultaneously etching said fifth layer and portions of said third layer exposed through said fourth layer of organic material to expose portions of said second layer first metallization.

2. The process of claim 1 wherein said first layer of organic material comprises polyimide.

3. The process of claim 1 wherein said fourth layer of organic material comprises polyimide.

4. The process of claim 3 wherein said step of reactive ion etching comprises etching with oxygen ions.

5. The process of claim 1 wherein said second layer of first metallization comprises aluminum.

6. The process of claim 5 wherein said third layer of a first insulating material comprises deposited silicon oxide or silicon nitride.

7. The process of claim 1 further comprising the step of depositing a sixth layer of a second metallization overlying said fourth layer and selectively contacting said second layer of first metallization.

8. A process for fabricating a semiconductor device which comprises the steps of: providing a semiconductor substrate; patterning a first layer of metallization overlying said substrate; forming a second layer of inorganic insulator and then a third layer of organic insulator overlying said first layer of metallization; reactive ion etching openings in said third layer of organic insulator to expose portions of said second layer of inorganic insulator; etching said exposed portions of said second layer of inorganic insulator to expose portions of said first layer of metallization; depositing a fourth layer of metallization and a fifth layer of inorganic insulator overlying said third layer of organic insulator, said fourth layer of metallization selectively contacting said first layer of metallization through said openings; removing portions of said fifth layer of inorganic insulator to expose portions of said fourth layer of metallization; removing said exposed portions of said fourth layer of metallization to leave a pattern of metallization overlaid by a remaining portion of said fifth layer of inorganic insulator; providing a sixth layer of organic insulator and a seventh layer inorganic material overlying said pattern of metallization forming an opening in said seventh layer to expose portions of said sixth layer; reactive ion etching said sixth layer of organic insulator through said opening in said seventh layer to selectively expose portions of said fifth layer of inorganic insulator; and simultaneously etching said exposed portions of said seventh layer and fifth layer of inorganic insulator to expose portions of said pattern of metallization.

9. The process of claim 8 wherein said first layer of metallization and said fourth layer of metallization comprise aluminum.

10. The process of claim 9 wherein said third layer of organic insulator and said sixth layer of organic insulator comprise polyimide.

11. The process of claim 10 wherein said steps of reactive ion etching comprise etching in oxygen ions.

12. The process of claim 11 wherein said second layer of inorganic insulator and said fifth layer of inorganic insulator comprise deposited silicon oxide or silicon nitride.

13. A process for fabricating a semiconductor device which comprises the steps of: providing a semiconductor substrate; forming in sequence overlying said substrate a first metallization pattern, a second protective layer, a third layer of polyimide, a fourth layer of metallization, a fifth protective layer, a sixth layer of polyimide and a seventh masking layer; reactive ion etching said third layer of polyimide to expose portions of said second protective layer; etching said exposed portions of said second protective layer; patterning said fifth protective layer and said fourth layer of metallization to leave remaining portions of said fifth protective layer overlying remaining portions of said fourth layer of metallization; forming a pattern in said seventh masking layer reactive ion etching openings in said sixth layer of polyimide through said pattern in said seventh masking layer to expose part of said remaining portion of said fifth protective layer; and simultaneously etching said seventh masking layer and portions of said fifth protective layer exposed through said openings.

* * * * *